(12) United States Patent
Le Gouet et al.

(10) Patent No.: US 8,891,282 B2
(45) Date of Patent: Nov. 18, 2014

(54) PHOTON ECHO QUANTUM MEMORY AND METHOD

(75) Inventors: Jean-Louis Le Gouet, Bures sur Yvette (FR); Thierry Chaneliere, Les Ulis (FR)

(73) Assignee: Centre National de la Recherche Scientifique, Paris (FR)

( * ) Notice: Subject to any disclaimer, the term of this patent is extended or adjusted under 35 U.S.C. 154(b) by 150 days.

(21) Appl. No.: 13/454,388

(22) Filed: Apr. 24, 2012

(65) Prior Publication Data

US 2013/0279235 A1 Oct. 24, 2013

(51) Int. Cl.
G11C 13/04 (2006.01)
G11C 13/06 (2006.01)

(52) U.S. Cl.
USPC .......................................... 365/106

(58) Field of Classification Search
None
See application file for complete search history.

(56) References Cited

U.S. PATENT DOCUMENTS

2011/0222387 A1 * 9/2011 Ham ............................ 369/59.1

OTHER PUBLICATIONS

H.-J. Briegal, et al., "Quantum repeaters for communication," Institut für Theoretische Physik et al., Published Mar. 20, 1998 (8 pages).
Nicolas Sangouard et al., "Analysis of a quantum memory for photons based on controlled reversible inhomogeneous broadening," group of applied Physics-Optics et al., Geneva, Switzerland, Jan. 30, 2007 (9 pages).
M. S. Silver et al., "Selective spin inversion in nuclear magnetic resonance and coherent optics through an exact solution of the Bloch-Riccati equation," Apr. 1985 (3 pages).
V Dammon et al., "Revival of silences echo and quantam memory for light," New Journal of Physics, Published Sep. 20, 2011 (13 pages).

* cited by examiner

*Primary Examiner* — James G Norman
(74) *Attorney, Agent, or Firm* — Osha Liang LLP

(57) ABSTRACT

A quantum memory and method are proposed. The quantum memory includes an ensemble of atoms embedded in a storage medium and at least one light source for emitting towards the storage medium first, second and third light pulses, the first light pulse carrying information to be stored. The at least one light source is adapted for emitting second and third light pulses which are such that a photon echo substantially carrying information stored by the first light pulse is emitted by the ensemble of atoms after emission of the third light pulse.

40 Claims, 6 Drawing Sheets

PHOTON ECHO QUANTUM MEMORY AND METHOD

FIELD OF THE INVENTION

The subject disclosure relates to the field of scalable quantum communications, and more particularly to a photon-echo quantum memory and method for storing and retrieving quantum information.

BACKGROUND

Quantum networks have been attracting increased interest over the recent years. In such networks, information is carried by quantum systems which are transmitted over transmission links. In the case of transmission of photons over optical transmission links, the transmission distances are limited by absorption and scattering in optical fibers, which result in transmission loss, in the same way as in standard optical networks.

FIG. 1 illustrates a quantum network with direct transmission over an optical fiber. The source node (1) transmits photons to the destination node (2). For application such as quantum cryptography which involves the distribution of quantum keys over the communication link, the transmission of a single photon over a direct transmission link of length greater than 100 km cannot be achieved with an acceptable signal-to-noise ratio (SNR). Indeed, such signal-to-noise ratio (and hence the rate of received photons at the destination node over time) decreases exponentially with the length of the direct transmission link. For example, if we assume a direct transmission link of length L=1000 km, the signal-to-noise ratio is of the order of 10-20. In classical optical networks, transmission losses are reduced through the use of repeater nodes which are placed in between the source node and the destination node, generally separated by a distance which is acceptable from an SNR standpoint given the desired SNR between the source node and the destination node, and which include an amplifier for amplifying a received signal before retransmitting it to the next node of the network. However, the use of such repeaters which provide successive amplification of a signal during transmission over a long-haul communication link (e.g. of length>1000 km) is not efficient in quantum communications, as amplifying a quantum signal implies the loss of the quantum properties of such signal, resulting in the loss of quantum information carried by the signal. This limitation of quantum systems is sometimes referred to as the "no-cloning theorem".

A so-called "quantum repeater" scheme was proposed in 1998 to allow scalable quantum communications, which aim at extending the span of quantum communications over long distances (H. Briegel, W. Duer, J. L. Cirac & P. Zoller, Phys. Rev. Letter, 81, 5932 (published in 1998)). The use of quantum repeaters (3a, 3b) in this context has led to research carried out to develop so-called quantum memories (4a, 4b) which allow the storage of photons in a storage medium and retrieval of such stored photons.

Photon-echo techniques have been investigated for quantum memory applications. Schemes such as the two-pulse photon echo (2PE) and three-pulse photon echo (3PE), in which an input pulse is followed by one or two strong rephasing pulses, respectively, have been considered. However, the strong optical rephasing pulses used in the 2PE and 3PE techniques invert the atomic population, thereby causing the storage medium to operate in gain regime which generates noise. Controlled reversible inhomogeneous broadening (CRIB) and atomic frequency combs (AFCs) are two different approaches in the field of photon-echo quantum memories which have been proposed to mitigate this drawback. These approaches are unpractical in that they all require a complex preparation phase.

There remains a need for an improved quantum memory method and device which does not require a complex preparation phase.

SUMMARY

It is an object of the present subject disclosure to provide a quantum memory for storing and retrieving quantum information without requiring a complex preparation phase, as well as a quantum information storage and retrieval method.

A quantum memory according to an aspect of the present subject disclosure comprises an ensemble of atoms embedded in a storage medium, at least one light source for emitting towards the storage medium first, second and third light pulses, the first light pulse carrying information to be stored. The at least one light source is adapted for emitting second and third light pulses which are such that a photon echo substantially carrying information stored by the first light pulse is emitted by the ensemble of atoms after emission of the third light pulse.

A quantum information retrieval apparatus intended to retrieve quantum light information stored by a first light pulse in an ensemble of atoms embedded in a storage medium according to another aspect of the present subject disclosure comprises at least one light source for emitting towards the storage medium second and third light pulses which is adapted for emitting second and third light pulses which are such that a photon echo substantially carrying quantum light information stored by the first light pulse is emitted by the ensemble of atoms after emission of the third light pulse.

A method for storing and retrieving quantum information from a quantum memory comprising an ensemble of atoms embedded in a storage medium according to yet another aspect of the present subject disclosure comprises emitting towards the storage medium a first light pulse that carries quantum information to be stored and emitting towards the storage medium second and third light pulses, wherein the second and third light pulses are such that a photon echo substantially carrying information stored by the first light pulse is emitted by the ensemble of atoms only after emission of the third light pulse.

A method for retrieving quantum information stored in a quantum memory comprising an ensemble of atoms embedded in a storage medium by means of a first light pulse according to yet another aspect of the present subject disclosure comprises emitting towards the storage medium second and third light pulses, wherein the second and third light pulses are such that a photon echo substantially carrying information stored by the first light pulse is emitted by the ensemble of atoms only after emission of the third light pulse.

In some embodiments, the ensemble of atoms is an ensemble of two-level atoms. However other configurations can be used, such as for example an ensemble of three-level atoms as will be described below.

In some embodiments, the storage medium is an impurity-doped crystal. For example, in some embodiments, the impurity-doped crystal is a rare-earth ion doped crystal.

In some embodiments, the at least one light source is adapted for emitting the third light pulse at a time greater than twice the time interval between emission of the first and second light pulses, for emitting second and third light pulses with an intensity and time/frequency profile such that they rotate substantially simultaneously the Bloch vectors of the atoms of the ensemble by an angle of $\pi$, and is further adapted such that the following conditions are met: $(|2\vec{k}_2-\vec{k}_1|-|\vec{k}|)\cdot L>\pi$ and $(|\vec{k}_1+2(\vec{k}_3-\vec{k}_2)|-|\vec{k}|)\cdot<<\pi$ wherein $\vec{k}_1$, $\vec{k}_2$, $\vec{k}_3$ are the wave vector of first, second and third light pulses, respectively, L is the length of the crystal, and $|\vec{k}|=|\vec{k}_1|=|\vec{k}_2|$ (where the operator |.| designates the modulus of a vector).

In some embodiments, the at least one light source is adapted for emitting second and third light pulses that counter propagate with first light pulse.

In some embodiments, the at least one light source is adapted for emitting second light pulse with a direction spaced by a $\pi/3$ radian angle with respect to the direction of the first light pulse, and emitting the third light pulse with a direction spaced by a $\pi/3$ radian angle with respect to the direction of the second light pulse.

In some embodiments, the at least one light source is adapted for emitting second and third light pulses so that the emitted second and third light pulses are $\pi$-pulses.

In some embodiments, the at least one light source is adapted for emitting first, second and third light pulses with respective time/frequency profiles such that the frequency span of the first pulse is included in the respective frequency spans of the second and third pulses.

In some embodiments, the at least one light source is adapted for emitting second and third light pulses so that the emitted second and third light pulses are frequency chirped pulses with a time profile such that only the combination of the second and third light pulses can phase together the atomic coherences of the atoms of the ensemble. For example, in some embodiments, the second and third light pulses are Adiabatic Rapid Passage (ARP) pulses, and in some embodiments they are Complex Hyperbolic Secant (CHS) pulses.

It should be appreciated that the present invention can be implemented and utilized in numerous ways, including without limitation as a process, an apparatus, a system, a device, and as a method for applications now known and later developed. These and other unique features of the system disclosed herein will become more readily apparent from the following description and the accompanying drawings.

BRIEF DESCRIPTION OF DRAWINGS

The present disclosure will be better understood and its numerous objects and advantages will become more apparent to those skilled in the art by reference to the following drawings, in conjunction with the accompanying specification, in which.

DETAILED DESCRIPTION

Figure 1:
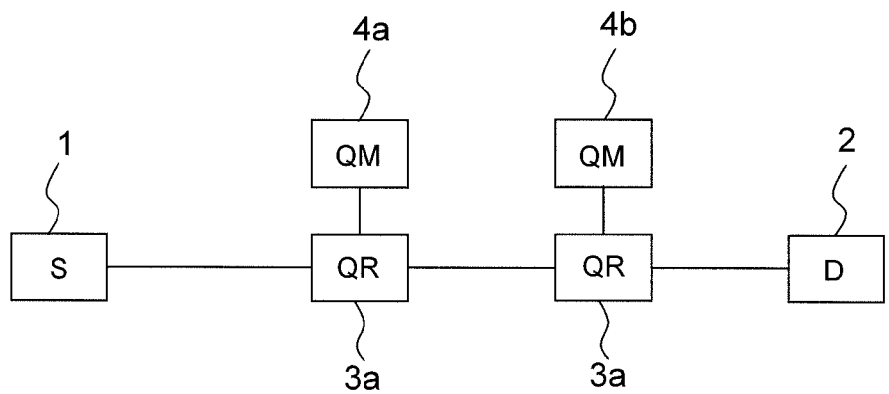
FIG. 1 is an illustrative drawing of a quantum network.

The subject technology overcomes many of the prior art problems associated with implementing quantum memories for light. The advantages, and other features of the components disclosed herein, will become more readily apparent to those having ordinary skill in the art form. The following detailed description of certain preferred embodiments, taken in conjunction with the drawings, set forth representative embodiments of the subject technology, wherein like reference numerals identify similar structural elements.

For clarity throughout the following description, arrows are shown to indicate the direction and ellipses to indicate additional components; such shorthand is for clarity in reference to the figures and is not meant in a limiting sense.

Figure 2:
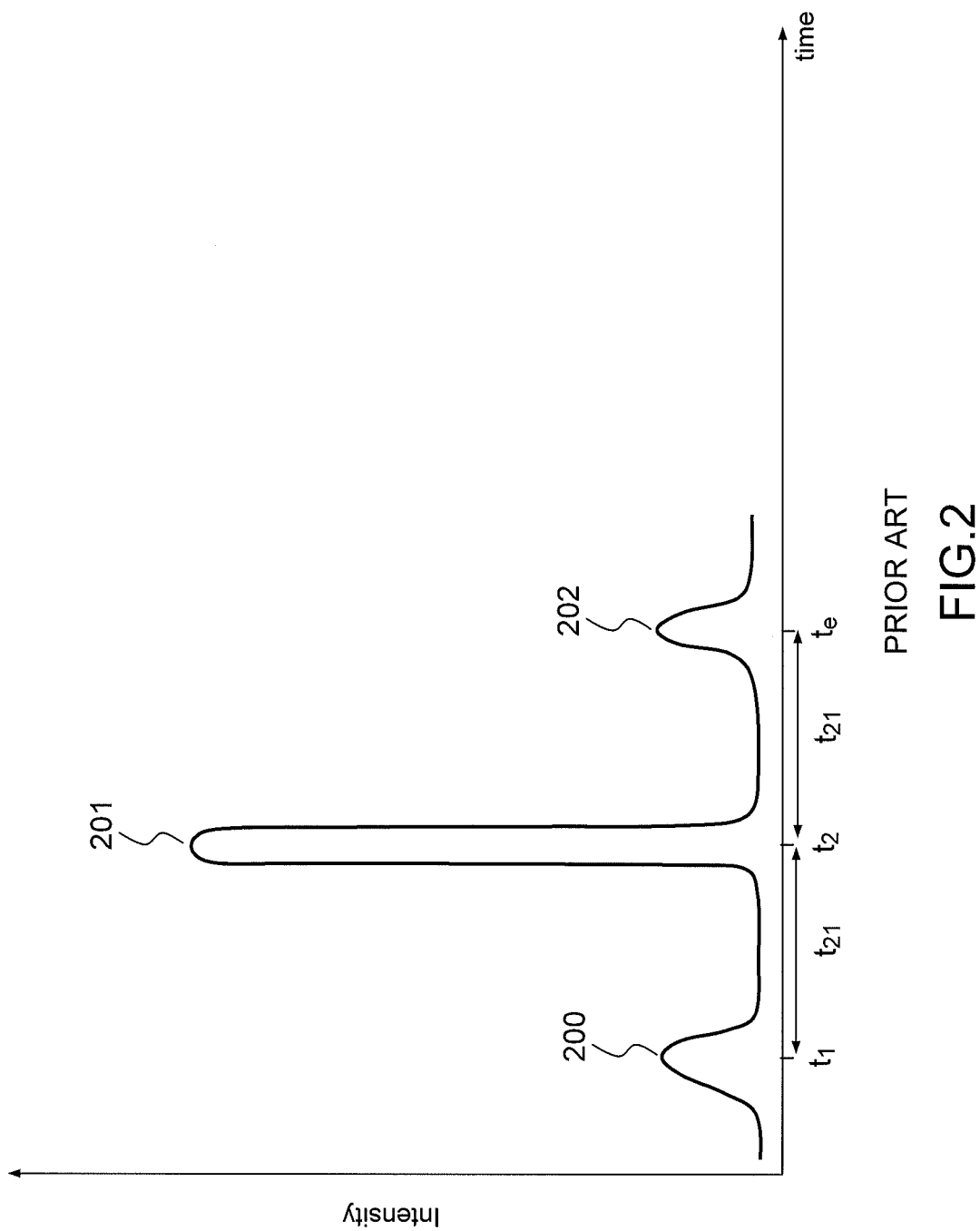
FIG. 2 illustrates the two-pulse photon echo (2PE) phenomenon.

FIG. 2 illustrates the two-pulse photon echo (2PE) phenomenon. The two-pulse photon echo uses a strong light pulse to produce the rephasing and trigger the retrieval of the stored information through emission of an echo carrying such stored information. Centered around time reference t1 on FIG. 2 is an initial signal (200)—typically Gaussian pulse shaped—of low intensity which shines on a medium composed of two-level atoms (e.g. a rare-earth ion doped crystal). This initial signal is absorbed in the medium by an inhomogeneously broadened atomic transition, resulting in each spectral component of the signal resonantly coupling with an atomic superposition state of the medium. At time $t_2$ a rephasing pulse of large area A (i.e. a pulse of integrated area equal to A) (201), such as a $\pi$-pulse (i.e. a pulse of integrated area substantially equal to $\pi$), induces the buildup of a macroscopic polarization (the atomic polarizations get phased together and create a macroscopic polarization) around the time $2\times t_{12}$, where $t_{12}=t_2-t_1$, and gives rise to a radiant response (202) (also known as "photon echo"). A is chosen sufficiently high so that the A-pulse excites the medium in order for a substantially complete population transfer between the levels to occur.

According to a first aspect there is provided a quantum memory wherein a second and third strong rephasing pulses are emitted towards the medium with phase conditions so that the echo of the normal two-pulse echo scheme is silenced, i.e. substantially reduced to an arbitrarily low intensity. An echo is generated after the third rephasing pulse that carries information retrieved from the memory. The second and third pulses are chosen with an integrated area (intensity profile) and time/frequency profile such that they generate a collective excitation in the atomic ensemble, i.e. a resonance reaction for most of the atoms of the 2-levels medium within the excited spectral band substantially simultaneously. More specifically, the second pulse is chosen with an integrated area and a time/frequency profile such that it promotes most of the atoms of the medium to the upper level of the optical transition and reverses the phase of the atomic coherences substantially simultaneously. The third pulse is chosen with an integrated area and a time/frequency profile such that it is able to bring the atoms of the medium back to the ground level of the optical transition substantially simultaneously, and reverse the phase of the atomic coherence, so that they emit the echo that carries information retrieved from the memory. In an embodiment, the second and third pulses are chosen to be $\pi$-pulses.

In a preferred embodiment, the respective time/frequency profiles of the first, second and third pulses are chosen so that the frequency span of the first pulse is included in each of the respective frequency spans of the second and third pulses.

Figure 3:
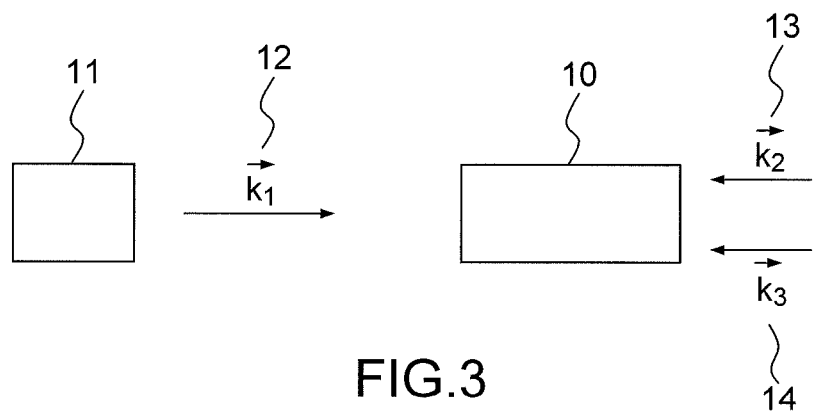
FIG. 3 illustrates a quantum memory according to one or more embodiments of the invention.

The embodiment illustrated in FIG. 3 can be particularly advantageous for a quantum memory operating in the optical frequency domain. Shown on FIG. 3 is an ensemble of two-level atoms comprised in a storage medium (10). A plurality of light sources (11) is configured for emitting towards the storage medium (10) a light signal (12) carrying information to be stored. This initial signal (12) for signal storage is preferably pulse-shaped with low intensity (e.g. Gaussian shaped) as it typically carries a few photons to be stored in the quantum memory, and is directed along wave vector noted $\vec{k}_1$. The storage medium (10) is of thickness (or length) L, preferably chosen in a known manner so as to allow for an efficient capture of the initial signal pulse.

The storage medium (10) may be composed of an impurity doped crystal, for instance a rare-earth ion doped crystal (REIC). Examples of such REIC having favorable properties include a thulium $Tm^{3+}$ ion doped YAG ($Y_3 Al_5 O_{12}$) crystal, wherein 0.5% of the $Y^{3+}$ ions were replaced with $Tm^{3+}$ ions, and a Erbium $Er^{3+}$ ion doped YSO ($Y_2 SiO_5$) crystal, wherein 0.005% of the $Y^{3+}$ ions were replaced with $Er^{3+}$ ions. The REIC is cooled by being placed in a cryostat, which may be a liquid helium cryostat. Example of temperatures at which the crystal is kept in the cryostat are 2.8 K for the $Tm^{3+}$: YAG crystal, and 2 K for the $Er^{3+}$: YSO crystal. The cooling of the crystal with the cryostat allows for an increase of the optical coherence lifetime of the ensemble of two-level atoms comprised in the crystal. An increased optical coherence lifetime value is beneficial to the proposed scheme as the storage and retrieval under a photon-echo scheme will occur in a time-frame which is shorter than the optical coherence lifetime. Other steps besides cooling of the crystal can be considered to increase the optical coherence lifetime, such as for instance lifting the Kramers degeneracy with a magnetic field.

Signal recovery is achieved through two rephasing pulses (13) and (14) sent at predetermined times towards the storage medium (10). The wave vectors of the rephasing pulses are noted $\vec{k}_2$ and $\vec{k}_3$, respectively.

The light source (11) generates a second pulse (13), of wave vector $\vec{k}_2$, towards the storage medium (10). The intensity of this second pulse (13) is chosen so that, upon hitting the storage medium (10), it rotates the Bloch vector by an angle of $\pi$. This $\pi$-rotation reverses the phase of atomic coherences and promotes the atoms of the storage medium (10) to the upper level of the optical transition. As is shown on FIG. 4 the atomic coherences (30a-30c) would in the normal 2PE scheme get phased together again at time $t_e = t_1 + 2 \times t_{12}$, where $t_{ij} = t_j - t_i$, and radiate an echo signal around time $t_e$. This population inversion effected by the second pulse (13) would indeed place the storage medium (10) in a gain regime in which it relaxes by spontaneous emission. Such spontaneous emission can be considered as noise detrimental to the recovery of stored information, as the primary echo signal generated would carry part of the stored information.

This undesired noise is significantly reduced by a third pulse (14), of wave vector $\vec{k}_3$, generated by the light source (11) towards the storage medium (10). The intensity of this third pulse (14) is chosen so that, upon hitting the storage medium (10), it also rotates the Bloch vector by an angle of $\pi$, and therefore brings the atoms of the storage medium (10) back to the ground level. Furthermore, this third pulse is generated around a time $t_3$ which is chosen greater than $t_e$, so that it is generated after the time at which the echo signal would be radiated under the normal 2PE scheme. As is shown on FIG. 4 the atomic coherences get phased together again at time $t_e' = t_1 + 2 \times t_{23}$, where $t_{ij} = t_j - t_i$, and a secondary echo signal is radiated around time $t_e'$.

In an embodiment, the light source for emitting the initial storage (12) for signal storage is distinct from the light source for emitting the second of third pulse, in view of the difference in intensity between the initial pulse and the second and third pulse.

The wave vectors $\vec{k}_1$ and $\vec{k}_2$ of the first and second pulses (12) and (13) are chosen so that they do not give rise to a primary echo emission in the direction $\vec{k}_e = 2 \cdot \vec{k}_2 - \vec{k}_1$. This is achieved by choosing the wave vectors $\vec{k}_1$ and $\vec{k}_2$ so that they do not meet a phase matching condition that is necessary for the primary echo to be emitted.

In one embodiment, the wave vectors $\vec{k}_1$ and $\vec{k}_2$ are chosen so that $(k_e - k) \times L > \pi$ where $k = |\vec{k}_1| = |\vec{k}_2|$ with $k_0 = |\vec{k}_0|$ (where the operator |.| designates the modulus of a vector).

Indeed, a primary echo emission would be emitted in the direction $k'_e = 2 \cdot k'_2 - k_1'$ if the phase matching condition: $(k_e - k) \times L \ll \pi$ (with $k = |\vec{k}_1| = |\vec{k}_2|$) was met. For example, the phase matching condition would be met if $k_e$ was chosen close to $k$.

If the conditions $(k_e - k) \times L > \pi$ where $k = |\vec{k}_1| = |\vec{k}_2|$ and $k_e = |k'_e|$ are met, no primary echo is emitted, but the macroscopic polarization does survive. The violation of the phase matching condition does not affect atomic coherences, which get phased together around time $t_e' = t_1 + 2 \times t_{23}$ after the third pulse (14) has been generated towards the storage medium (10). Therefore, despite the absence of a primary echo if the phase matching condition is violated for $k_e'$, an echo (which would be the secondary echo in the presence of a primary one) can be generated at time $t_e' = t_1 + 2 \times t_{23}$ provided that its wave vector $\vec{k}'_e$ satisfies the phase matching condition. This wave vector $\vec{k}'_e$ can be estimated to be:

$$\vec{k}'_e = 2 \cdot \vec{k}_2 31 \vec{k}_e = \vec{k}_1 + 2 \cdot (\vec{k}_3 - \vec{k}_2) \tag{100}$$

Therefore, if the two following phase conditions ((101) and (102)) are met, the primary echo is "silenced" (i.e. is not emitted) and only the secondary echo is emitted, and furthermore carries the stored quantum information and can be expected to occur at a predetermined time.

$$(|2\vec{k}_2 - \vec{k}_1| - |\vec{k}|) \cdot L > \pi \tag{101}$$

$$(|\vec{k}_1 + 2(\vec{k}_3 - \vec{k}_2)| - |\vec{k}|) \cdot L \ll \pi \tag{102}$$

Equation (101) expresses the fact that the phase matching condition is violated for the first echo (thereby silencing this first echo), and equation (102) expresses the fact that this same phase matching condition is met for the second echo. In this way, the loss of stored quantum information in the first echo is greatly attenuated, and one can control when the stored quantum information is recovered (emission of the second echo is expected at $t_e' = t_1 + 2 \times t_{23}$).

When the condition expressed by equation (101) is fulfilled, the primary echo is silenced but radiative emission remains in phase with atomic polarization over the distance $\pi/|k_e - k|$ (where |.| is the absolute value operator) where $k = |\vec{k}_1| = |\vec{k}_2|$ and $k_6 = |\vec{k}_e|$. Therefore, some stored quantum information can creep in the medium over that coherence length. The mapping is not significantly affected if $\pi/|k_e - k|$ (where |.| is the absolute value operator) is much smaller than the $\alpha^{-1}$ characteristic distance, where $\alpha$ stands for the absorption coefficient of the storage medium.

In the above equation (100), if $\vec{k}_2 = \vec{k}_2$, then $\vec{k}'_e = \vec{k}_1$. So if the direction $\vec{k}_2$ is chosen close to the direction $\vec{k}_2$, the echo of wave vector $\vec{k'}_e$ is emitted substantially in the same direction ($\vec{k_1}$) as the initial signal, irrespective of the direction of the two rephasing pulses (second pulse (13) and third pulse (14)) $\vec{k_2}$ and $\vec{k_3}$, respectively. This configuration is illustrated on FIG. 3.

The quantum information recovery efficiency can be estimated based on the calculations effected for the CRIB protocol and detailed by Sangouard et al. in their paper "Analysis of a quantum memory for photons based on controlled reversible inhomogeneous broadening" (2007 Phys. Rev. A 75 032327), which is incorporated herein by reference.

According to one embodiment, the two rephasing pulses are produced in a direction so that they counter propagate with the incoming signal, as illustrated on FIG. 3. In this configuration, the two rephasing pulses follow the same path, in an opposite direction to the incoming signal field. The echo is then emitted in substantially the same direction ($\vec{k'}_e$) as the one of the initial echo ($\vec{k_1}$). The counterpropagating light pulses are generated by the light source (11) through a plurality of laser beam splitting devices.

Figure 5:
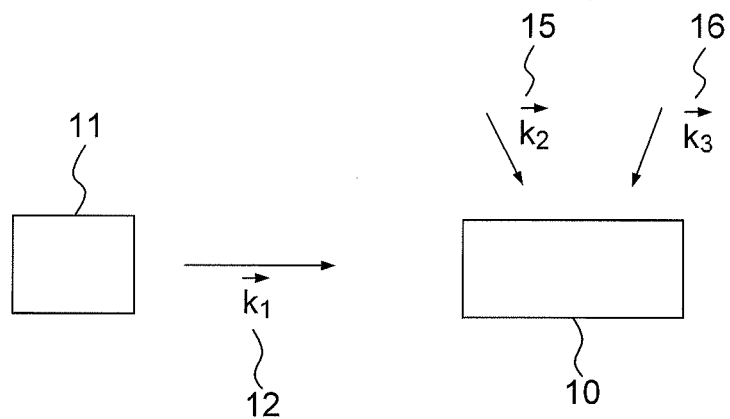
FIG. 5 illustrates a quantum memory according to one or more embodiments of the invention.

Shown in FIG. 5 is another embodiment, according to which the two rephasing pulses (15) (16) illuminate the storage medium (10) from the side. The echo is emitted in the backward direction as compared to the one of the storage pulse ($\vec{k'}_e = -\vec{k_1}$) if ($\vec{k_1}, \vec{k_2}) = \pi/3$ and ($\vec{k_2}, \vec{k_2}) = \pi/3$. FIG. 5 shows an ensemble of two-level atoms constituting a storage medium (10), and a light source (11) configured for producing towards the storage medium (10) light pulses of wave vectors $\vec{k_1}$, $\vec{k_2}$ and $\vec{k_2}$, respectively. The light source (11) is provided with beam splitting devices arranged so that the direction of $\vec{k_2}$ is spaced by a $\pi/3$ radian angle with respect to that of $\vec{k_1}$, i.e. ($\vec{k_1}, \vec{k_2}) = \pi/3$, and the direction of $\vec{k_2}$ is spaced by a $\pi/3$ radian angle with respect to the direction of $\vec{k_2}$, i.e. ($\vec{k_2}, \vec{k_2}) = \pi/3$.

In this configuration, an echo can be expected to be emitted in the direction opposite to the one of the first light pulse ($\vec{k'}_e = -\vec{k_1}$). Assuming that the width of the storage medium (10) is smaller than its length (L) in the direction of the first pulse (e.g. with a medium which is rectangular polygon shaped), the second and third pulses illuminate the storage medium (10) from the sides, and penetrate a shorter distance than in the above described embodiment wherein the two rephasing light pulses are emitted in a direction parallel to the greater length of the storage medium (10. The two rephasing light pulses may therefore undergo less propagation distortion, which results in a higher recovery efficiency, which can be measured, in the absence of coherence relaxation, as $(1-e^{-\alpha L})^2$ where $\alpha$ stands for the absorption coefficient of the storage medium, and approaches 100% when $\alpha.L \gg 1$.

In another embodiment, one considers an ensemble of three-level atoms, e.g. a three-level so-called "lambda system". In such cases, tTwo additional $\pi$-pulses may be used to convert the optical coherences into a ground state coherences and back. When the atoms of the ensemble are two-level atoms, the superposition states between the two levels are separated by an optical frequency. With three-level atoms, one additional $\pi$-pulse is used for converting the atomic optical coherences into Raman coherences, which will stop the evolution of the phases of atomic optical coherences. Another additional $\pi$-pulse is used for converting the atomic Raman coherences back into atomic optical coherences, and the phases of atomic optical coherences will resume their evolution. This way, the storage time may be increased far beyond the optical coherence lifetime.

Figure 4:
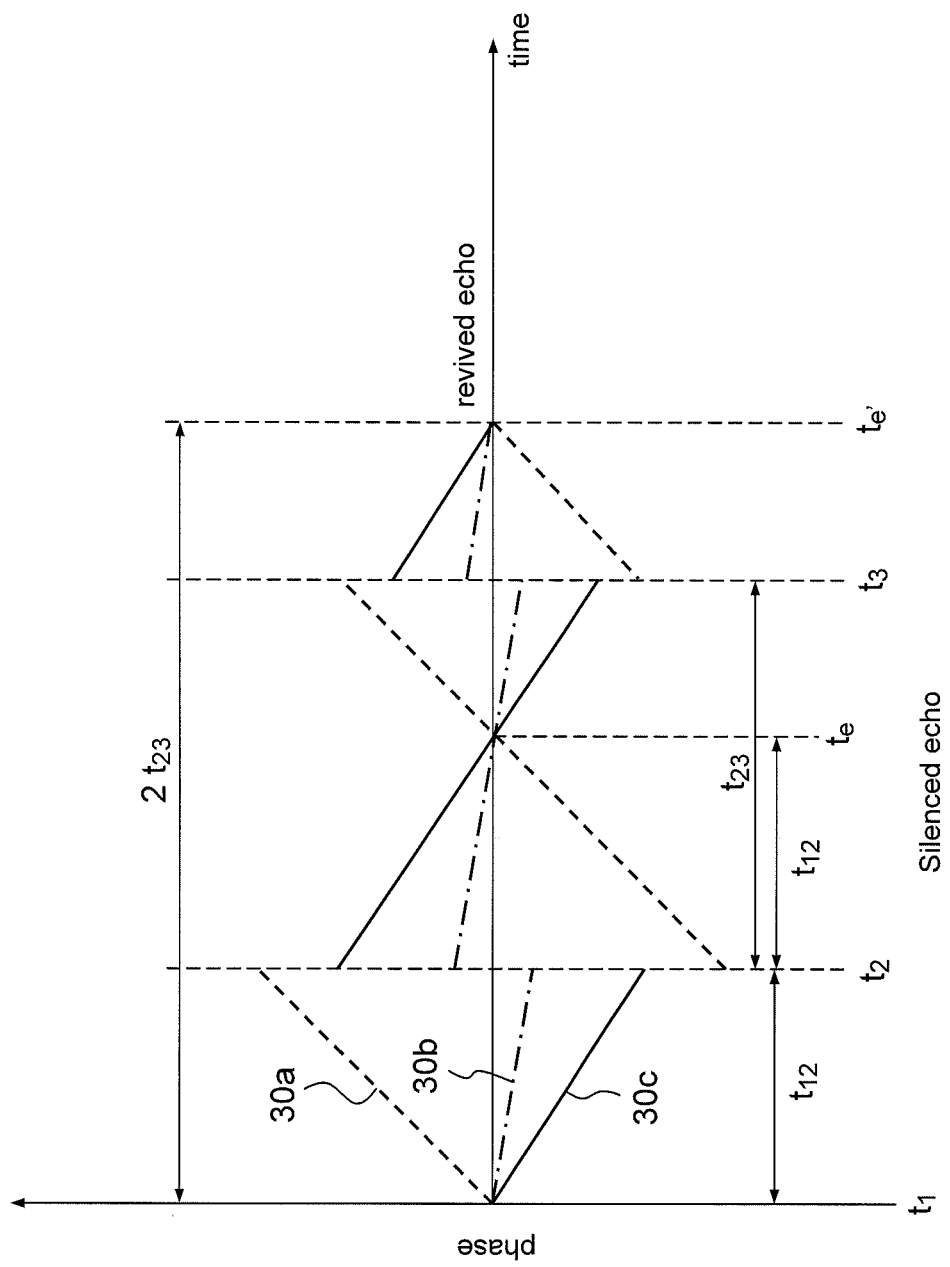
FIG. 4 illustrates the timings of light pulses and photon echo in one or more embodiments of the invention.

FIG. 4 illustrates the phase evolution of the atomic coherences from the time $t_1$ at which the initial pulse shines on the storage medium (memory input) to the time $t_1+2\times(t_3-t_2)$ at which the echo is generated (memory output). Excitation at time $t_1$ gives rise to atomic coherences. Departing from their initial common phase, the atomic coherences (30a, 30b, 30c) evolves at different rates (illustrated on FIG. 4 by the different types of dashed lines), depending on their detuning from a reference. Rephasing pulses are shone at times $t_2$ and $t_3$. The atomic coherences get phased together at time $t_1+2\times t_{12}$ (where $t_{12}=t_2-t_1$) but the primary echo is silenced by spatial phase mismatching. The echo is revived at time $t_1+2\times t_{23}$ (where $t_{23}=t_3-t_2$).

Figure 6:
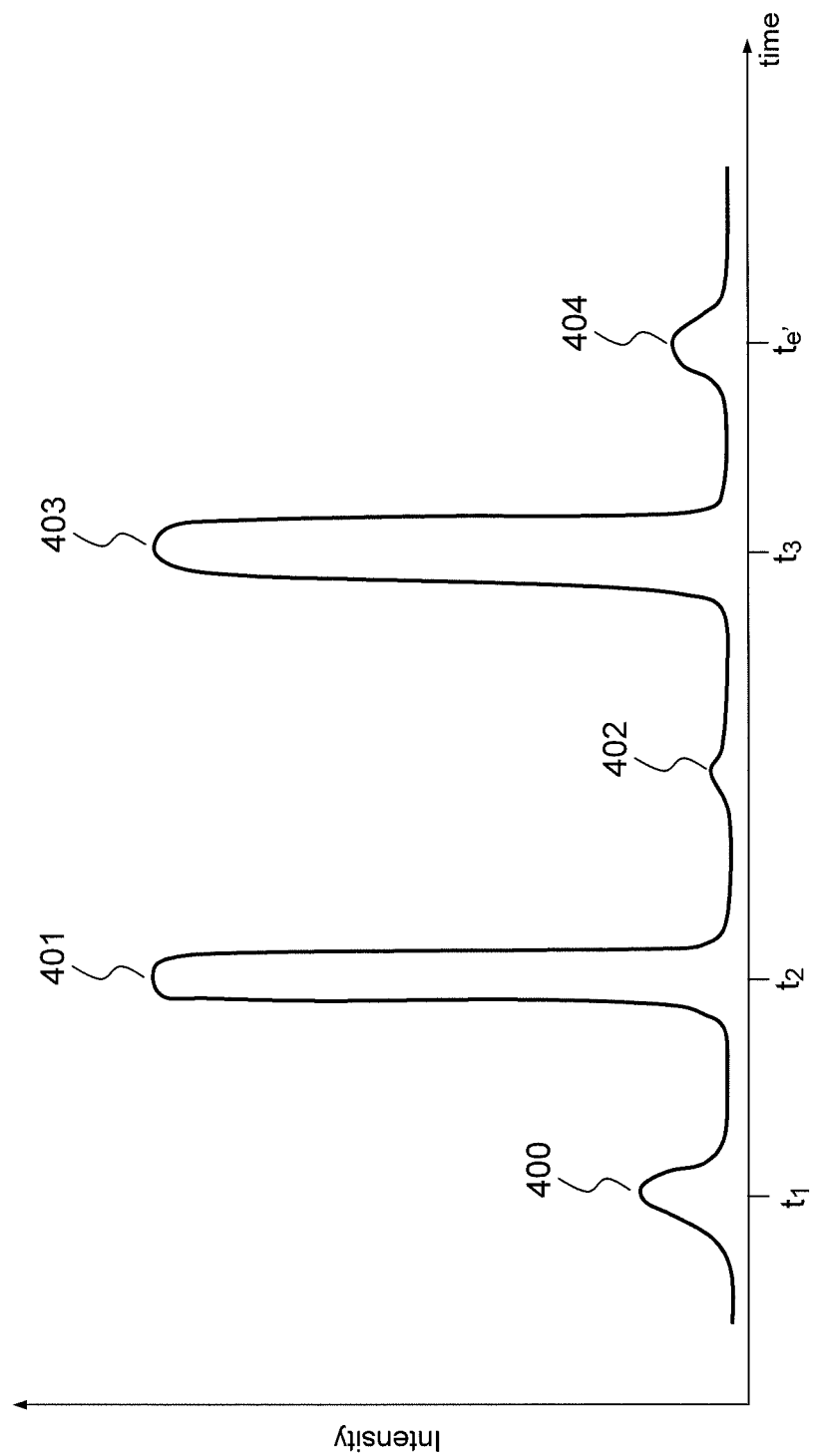
FIG. 6 illustrates the stored quantum information retrieval according to one or more embodiments of the invention.

FIG. 6 illustrates the pulse sequence with the initial pulse and the two rephasing pulses. An initial pulse (400), carrying the information to be stored, shines on the storage medium at time $t_1$. Then a strong pulse (e.g. a $\pi$-pulse) (401) hits the medium at time $t_2$, rotating the Bloch vector by an angle of $\pi$. The effect of violating the phase matching condition for this first strong pulse is to significantly reduce the intensity of the echo (402) that would be observed in a classic 2PE scheme. A second strong pulse (e.g. a $\pi$-pulse) (403) hits the medium at time $t_3$. The phase-matching condition is respected for this second strong pulse, and an echo (404) is formed at $t_1+2\times(t_3-t_2)$. This echo carries information that was stored and which is retrieved from the quantum memory.

According to a second aspect there is provided a quantum memory wherein a second and third strong pulses are emitted towards the medium with frequency sweeping so that the echo of the normal two-pulse echo scheme is silenced, i.e. substantially reduced to an arbitrarily low intensity. An echo is generated after the third pulse that carries information retrieved from the memory.

According to an embodiment, frequency chirped pulses are used instead of strong rephasing pulses which rotate the Bloch vectors substantially simultaneously (such as $\pi$-pulses). Chirped pulses, whose frequency is scanned at a rate r, will rotate the Bloch vectors sequentially. The second and third light pulses emitted by the light source towards the storage medium are chirped pulses. The chirped pulses are chosen with a time profile such that, while the first chirped pulse does not give rise to an echo, the second chirped pulse achieves refocusing of the Bloch vectors so that the atomic coherences are phased together, which generates emission of an echo.

Chirped pulses can be applied to the medium in which quantum information is stored by means of adiabatic rapid passage (ARP) processes. The ARP process is described in M. S. Silver, R. I. Joseph, D. I. Hoult, Phys. Rev. A 31, 2753 (1985), which is incorporated herein by reference. Under the conditions of adiabatic rapid passage, the Bloch vector adiabatically follows the driving vector on the Bloch sphere and $\pi$-radian flipping can be achieved efficiently over the scanning range of the driving field. Refocusing of the Bloch vectors so that they are phased together is achieved by means of a second ARP process. This second ARP process is then able to give rise to an echo which allows retrieval of the quantum information stored by the first light pulse.

According to an embodiment, each applied ARP process includes chirping the frequency of a magnetic field with substantially fixed amplitude at a substantially constant rate. In this embodiment, the magnetic field is switched on and off at large detunings from the atoms.

In another embodiment, an ARP process based on Complex Hyperbolic Secant (CHS) pulses is used. Such an ARP process based on CHS pulses is described in the paper by de Seze et al. ("Coherent driving of Tm3+:YAG ions using a complex hyperbolic secant optical field", F. de Seze, F. Dahes, V. Crozatier, I. Lorgeré, F. Bretenaker, J. L. Le Gouët, eur. Phys. J. D 33, 343-355 (2005)), which is incorporated herein by reference.

Examples of quantum memories operating according to the two aspects of the present subject disclosure described above are provided in the paper authored by V. Damon et al., "Revival of silenced echo and quantum memory for light", dated Apr. 26, 2011 (New Journal of Physics 13 (2011) 093031).

It will be understood in the present disclosure that when the term "silenced" is used with reference to the echo normally observed in a 2PE scheme or the primary echo normally observed in a 3PE scheme, what is meant is that the intensity of this echo is substantially reduced, for example by a factor of 10, as compared to a conventional 2PE scheme.

Figure 7:
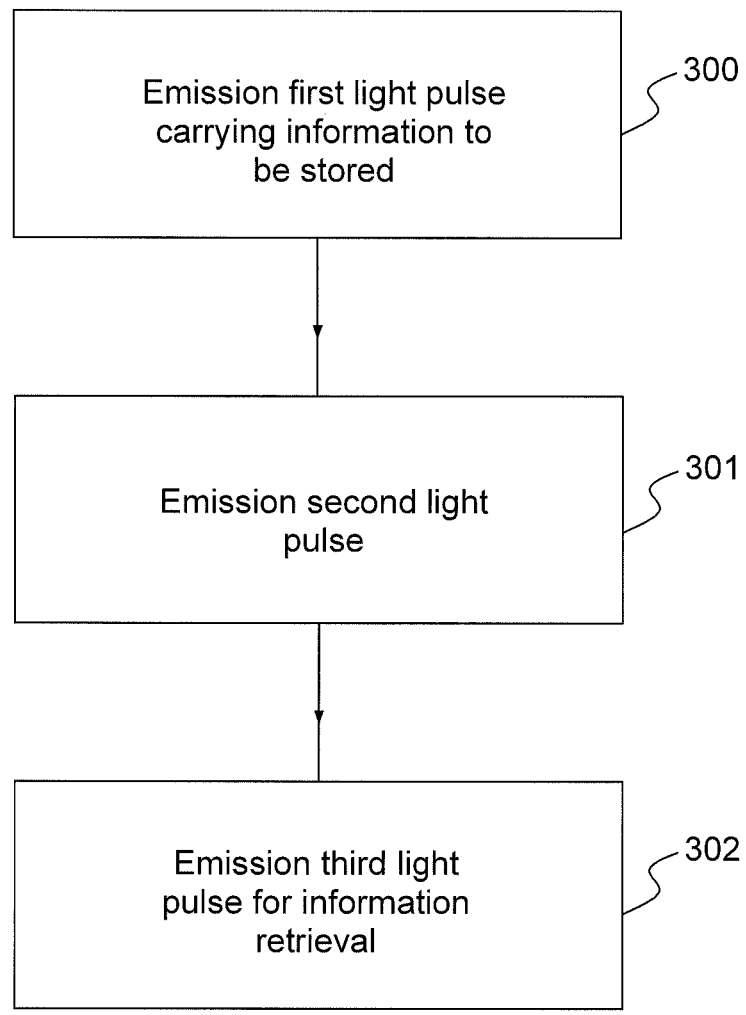
FIG. 7 is a flow chart illustrating a method for storing and retrieving quantum information from a quantum memory according to one or more embodiments of the invention.

FIG. 7 is a flow chart illustrating a method for storing and retrieving quantum information from a quantum memory that comprises an ensemble of two-level atoms embedded in a storage medium (such as a impurity-doped crystal). In some embodiments, the method begins with the storage of quantum information by emitting towards the storage medium a first light pulse that carries information to be stored (300). A second light pulse is then emitted (301) towards the storage medium, followed by a third light pulse (302) also emitted towards the storage medium. The emitted second and third light pulses have features such that they generate a photon echo that substantially carries the quantum information that was stored by the first light pulse which is emitted by the atomic ensemble only emission of the third light pulse. Said otherwise, the emitted second and third pulses have features such that the photon echo that would normally be spontaneously emitted by the atomic ensemble according to the classical 2PE scheme is substantially reduced so that, although it may still exist, its intensity is significantly reduced as compared to what it would be under the 2PE scheme, and it does not substantially carry quantum information that was stored by the first pulse. Therefore, it is only the photon echo which is generated by the second and third light pulses (301)(302) and emitted after the third light pulse has been emitted towards the storage medium that substantially carries quantum information that was stored by the first pulse.

In some embodiments of the method, the second and third light pulses are strong rephasing pulses, such as π-pulses, each of which will generate in the atomic ensemble a collective excitation such that the Bloch vectors of the atoms of the ensemble whose spectrum is within the spectral width of the rephasing pulses will be rotated substantially simultaneously by an angle of it radians. The second strong rephasing pulse further meets a spatial phase mismatching condition which allows for silencing (substantially reducing) the photon echo that would otherwise be spontaneously emitted by the ensemble, while the third strong rephasing pulse meets a spatial phase matching condition which allows for rephasing of the atomic coherences of the excited atoms and leads to the emission by the atomic ensemble of a photon echo that carries a substantial portion of the quantum information that was stored in the storage medium. The above-mentioned phase conditions can be expressed as $(|2\vec{k}_2-\vec{k}_1|-|\vec{k}|) \cdot L > \pi$ and $(|\vec{k}_1+2(\vec{k}_3-\vec{k}_2)|-|\vec{k}|) \cdot L \ll \pi$ wherein $\vec{k}_1$, $\vec{k}_2$, and $\vec{k}_3$ are the wave vector of first, second and third light pulses, respectively, and L is the length of the storage medium (typically a impurity-doped crystal, such as a rare-earth ions doped crystal), and $|\vec{k}|=|\vec{k}_1|=|\vec{k}_2|$ (where the operator |.| designates the modulus of a vector). For example, the phase conditions are met for a configuration in which the emitted second and third pulses counter propagate with the first light pulse that stores the quantum information in the storage medium.

In other embodiments of the method, a pair of successive frequency chirped pulses are used in place of the two strong rephasing pulses. In contrast to the strong rephasing pulses, the frequency chirped pulses will not generate in the atomic ensemble a collective excitation such that the Bloch vectors of the atoms of the ensemble whose spectrum is within the spectral width of the rephasing pulses are rotated substantially simultaneously by an angle of it radians. Instead, they will create in the atomic ensemble a collective excitation such that the Bloch vectors of the atoms of the ensemble are rotated sequentially by an angle of it radians as the frequency of the chirp corresponds to the atomic spectrum. This difference of excitation pattern is such that there will no longer be the conditions of the 2PE scheme with spontaneous emission of a photon echo after the second pulse. The time profiles of the second and third frequency chirped pulses are chosen such that the atomic coherences get phased back together after the emission of the third frequency chirped pulse.

Figure 8:
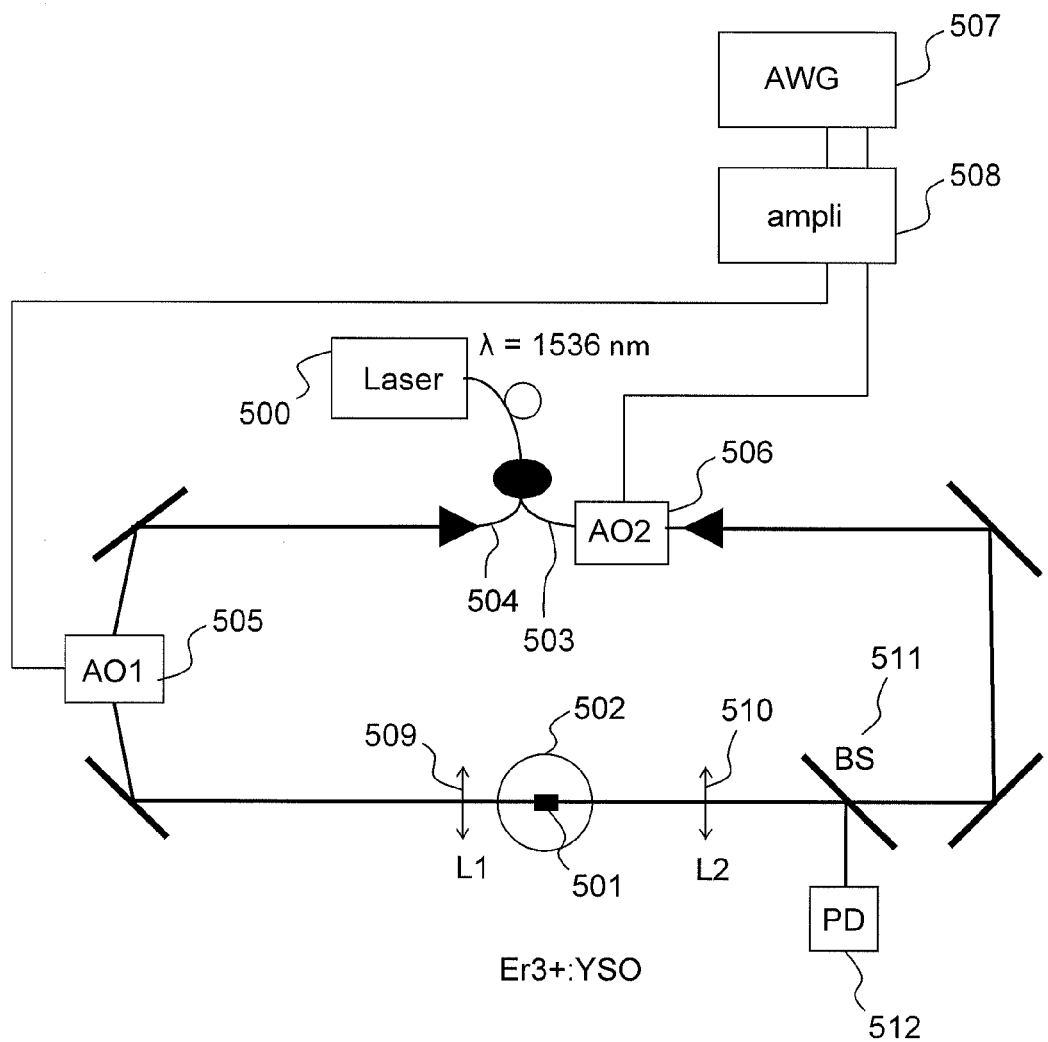
FIG. 8 illustrates an embodiment of a quantum memory.

Shown on FIG. 8 is a fibered laser (500) operating at wavelength λ=1536 nm for delivering the initial signal and rephasing beams (pulses) to a Erbium Er$^{3+}$ion doped YSO (Y$_2$SiO$_5$) crystal (501) placed in a cryostat (502). The laser (500) output is split into two arms (503-504). On one arm (504), a free-space acousto-optic modulator (AOM) (505) temporally shapes the initial signal pulse (signal pulse that carries the information to be stored). On the other arm (503), a fibered AOM (506), shapes the rephasing pulses in phase and amplitude (for recovery of the stored signal). By fibering the second AOM (506) output, one is able to maintain a fixed wavevector direction, irrespective of the frequency chirp that is imprinted on the beam of the AOM (506). The radio-frequency signals that control both AOMs (505, 506) are delivered by two synchronized outputs of a broadband arbitrary waveform generator (507) amplified by an amplifier (508). The initial signal and the rephasing pulses counter-propagate to the crystal (501) through the lenses L$_1$ and L$_2$ (509, 510). The echo is extracted to the photodiode (512) by the beam splitter (511). FIG. 8 illustrates an embodiement in which a single source is used for generating all the signal beams (initial signal and rephasing beams). Other embodiments can be considered in which the initial quantum signal to be stored in the quantum memory is delivered by a quantum source separate from the source that delivers the rephasing pulses.

Incorporation by Reference

All patents, published patent applications and other references disclosed herein are hereby expressly incorporated in their entireties by reference.

While the invention has been described with respect to preferred embodiments, those skilled in the art will readily appreciate that various changes and/or modifications can be made to the invention without departing from the spirit or scope of the invention as defined by the appended claims. In particular, the invention is not limited to specific embodiments regarding the light source(s) or light emitting device(s) for generating and emitting the various pulses and may be implemented using various light sources or light emitting devices or number thereof without departing from its spirit or scope as defined by the appended claims.

Although this invention has been disclosed in the context of certain preferred embodiments, it should be understood that certain advantages, features and aspects of the systems, devices, and methods may be realized in a variety of other embodiments. Additionally, it is contemplated that various aspects and features described herein can be practiced separately, combined together, or substituted for one another, and that a variety of combination and subcombinations of the features and aspects can be made and still fall within the scope of the invention. Furthermore, the systems and devices described above need not include all of the modules and functions described in the preferred embodiments.

Information and signals described herein can be represented using any of a variety of different technologies and techniques. For example, data, instructions, commands, information, signals, bits, symbols, and chips can be represented by voltages, currents, electromagnetic waves, magnetic fields or particles, optical fields or particles, or any combination thereof.

Depending on the embodiment, certain acts, events, or functions of any of the methods described herein can be performed in a different sequence, may be added, merged, or left out all together (e.g., not all described acts or events are necessary for the practice of the method). Moreover, in certain embodiments, acts or events may be performed concurrently rather than sequentially.

What is claimed is:

1. A quantum memory intended to store an incoming quantum light pulse, comprising:
    an ensemble of atoms embedded in a storage medium; and
    at least one light source for emitting towards the storage medium first, second and third light pulses, the first light pulse carrying quantum information to be stored;
    wherein the at least one light source is adapted for emitting second and third light pulses which are such that a photon echo substantially carrying quantum information stored by the first light pulse is emitted by the ensemble of atoms after emission of the third light pulse, and
    wherein the at least one light source is adapted for emitting the third light pulse at a time greater than twice the time interval between emission of the first and second light pulses, for emitting second and third light pulses with an intensity and time/frequency profile such that they rotate substantially simultaneously the Bloch vectors of the atoms of the ensemble by an angle of $\pi$, and is further adapted such that the following conditions are met:
    (i) $(|2\vec{k}_2 - \vec{k}_1| - |\vec{k}|) \cdot L > \pi$
    (ii) $(|\vec{k}_1 + 2(\vec{k}_3 - \vec{k}_2)| - |\vec{k}|) \cdot L << \pi$
    (iii) wherein $\vec{k}_1$, $\vec{k}_2$, and $\vec{k}_3$ are the wave vector of first, second and third light pulses, respectively, L is the length of the crystal, and $|\vec{k}| = |\vec{k}_1| = |\vec{k}_2|$ (where the operator |.| designates the modulus of a vector).

2. The quantum memory of claim 1, wherein the storage medium is an impurity-doped crystal.

3. The quantum memory of claim 2, wherein the impurity-doped crystal is a rare-earth ion doped crystal.

4. The quantum memory of claim 1, wherein the at least one light source is adapted for emitting second and third light pulses that counter propagate with first light pulse.

5. The quantum memory of claim 1, wherein the at least one light source is adapted for emitting second light pulse with a direction spaced by a $\pi/3$ radian angle with the direction of the first light pulse, and third light pulse with a direction spaced by a $\pi/3$ radian angle with the direction of the second light pulse, respectively.

6. The quantum memory of claim 1, wherein the at least one light source is adapted for emitting second and third light pulses so that the emitted second and third light pulses are $\pi$-pulses.

7. The quantum memory of claim 1, wherein the at least one light source is adapted for emitting first, second and third light pulses with respective time/frequency profiles such that the frequency span of the first pulse is included in the respective frequency spans of the second and third pulses.

8. The quantum memory of claim 1, wherein the at least one light source is adapted for emitting second and third light pulses so that the emitted second and third light pulses are frequency chirped pulses with a time profile such that only the combination of the second and third light pulses can phase together the atomic coherences of the atoms of the ensemble.

9. The quantum memory of claim 8, wherein the second and third light pulses are Adiabatic Rapid Passage (ARP) pulses.

10. The quantum memory of claim 8, wherein the second and third light pulses are Complex Hyperbolic Secant (CHS) pulses.

11. A quantum information retrieval apparatus intended to retrieve quantum light information stored by a first light pulse in an ensemble of atoms embedded in a storage medium, the apparatus comprising:
    at least one light source for emitting towards the storage medium second and third light pulses which is adapted for emitting second and third light pulses which are such that a photon echo substantially carrying quantum light information stored by the first light pulse is emitted by the ensemble of atoms after emission of the third light pulse, wherein the at least one light source is adapted for emitting the third light pulse at a time greater than twice the time interval between emission of the first and second light pulses, for emitting second and third light pulses with an intensity and time/frequency profile such that they rotate substantially simultaneously the Bloch vectors of the atoms of the ensemble by an angle of $\pi$, and is further adapted such that the following conditions are met:
    (i) $(|2\vec{k}_2 - \vec{k}_1| - |\vec{k}|) \cdot L > \pi$
    (ii) $(|\vec{k}_1 + 2(\vec{k}_3 - \vec{k}_2)| - |\vec{k}|) \cdot L << \pi$
    iii. wherein $\vec{k}_1$, $\vec{k}_2$, and $\vec{k}_3$ are the wave vector of first, second and third light pulses, respectively, L is the length of the crystal, and $|\vec{k}| = |\vec{k}_1| = |\vec{k}_2|$ (where the operator |.| designates the modulus of a vector).

12. The quantum information retrieval apparatus of claim 11, wherein the storage medium is an impurity-doped crystal.

13. The quantum information retrieval apparatus of claim 12, wherein the impurity-doped crystal is a rare-earth ion doped crystal.

14. The quantum information retrieval apparatus of claim 11, wherein the at least one light source is adapted for emitting second and third light pulses that counter propagate with first light pulse.

15. The quantum information retrieval apparatus of claim 11, wherein the at least one light source is adapted for emitting second light pulse with a direction spaced by a $\pi/3$ radian angle with the direction of the first light pulse, and third light pulse with a direction spaced by a $\pi/3$ radian angle with the direction of the second light pulse, respectively.

16. The quantum information retrieval apparatus of claim 11, wherein the at least one light source is adapted for emitting second and third light pulses so that the emitted second and third light pulses are π-pulses.

17. The quantum information retrieval apparatus of claim 11, wherein the at least one light source is adapted for emitting first, second and third light pulses with respective time/frequency profiles such that the frequency span of the first pulse is included in the respective frequency spans of the second and third pulses.

18. The quantum information retrieval apparatus of claim 11, wherein the at least one light source is adapted for emitting second and third light pulses so that the emitted second and third light pulses are frequency chirped pulses with a time profile such that only the combination of the second and third light pulses can phase together the atomic coherences of the atoms of the ensemble.

19. The quantum information retrieval apparatus of claim 18, wherein the second and third light pulses are Adiabatic Rapid Passage (ARP) pulses.

20. The quantum information retrieval apparatus of claim 18, wherein the second and third light pulses are Complex Hyperbolic Secant (CHS) pulses.

21. A method for storing and retrieving quantum information from a quantum memory comprising an ensemble of atoms embedded in a storage medium, the method comprising:
  emitting towards the storage medium a first light pulse that carries quantum information to be stored;
  emitting towards the storage medium second and third light pulses, wherein the second and third light pulses are such that a photon echo substantially carrying quantum information stored by the first light pulse is emitted by the ensemble of atoms only after emission of the third light pulse;
  emitting the third light pulse at a time greater than twice the time interval between emission of the first and second light pulses,
  emitting the second and third light pulses with an intensity and time/frequency profile such that they rotate substantially simultaneously the Bloch vectors of the atoms of the ensemble by an angle of π, and
  (i) $(|2\vec{k}_2-\vec{k}_1|-|\vec{K}|) \cdot L > \pi$
  (ii) $(|\vec{k}_1+2(\vec{k}_3-\vec{k}_2)|-|\vec{K}|) \cdot L \ll \pi$
  (iii) wherein $\vec{K}_1$, $\vec{K}_2$, and $\vec{K}_3$ are the wave vector of first, second and third light pulses, respectively, L is the length of the crystal, and $|\vec{K}|=|\vec{K}_1|=|\vec{K}_2|$ (where the operator |.| designates the modulus of a vector).

22. The method of claim 21, wherein the storage medium is an impurity-doped crystal.

23. The method of claim 22, wherein the impurity-doped crystal is a rare-earth ion doped crystal.

24. The method of claim 21, further comprising emitting the second and third light pulses such that they counter propagate with the first light pulse.

25. The method of claim 21, further comprising emitting the second light pulse with a direction spaced by a π/3 radian angle with respect to the direction of the first light pulse, and emitting the third light pulse with a direction spaced by a π/3 radian angle with respect to the direction of the second light pulse.

26. The method of claim 21, wherein the second and third light pulses are π-pulses.

27. The method of claim 21, wherein the first, second and third light pulses are emitted with respective time/frequency profiles such that the frequency span of the first pulse is included in the respective frequency spans of the second and third pulses.

28. The method of claim 21, wherein the second and third light pulses are frequency chirped pulses with a time profile such that only the combination of the second and third light pulses can phase together the atomic coherences of the atoms of the ensemble.

29. The method of claim 28, wherein the second and third light pulses are Adiabatic Rapid Passage (ARP) pulses.

30. The method of claim 28, wherein the second and third light pulses are Complex Hyperbolic Secant (CHS) pulses.

31. A method for retrieving quantum information stored in a quantum memory comprising an ensemble of atoms embedded in a storage medium by means of a first light pulse, the method comprising:
  emitting towards the storage medium second and third light pulses, wherein the second and third light pulses are such that a photon echo substantially carrying quantum information stored by the first light pulse is emitted by the ensemble of atoms only after emission of the third light pulse,
  emitting the third light pulse at a time greater than twice the time interval between emission of the first and second light pulses,
  emitting the second and third light pulses with an intensity and time/frequency profile such that they rotate substantially simultaneously the Bloch vectors of the atoms of the ensemble by an angle of π, and emitting the first, second and third light pulses such that the following conditions are met:
  (i) $(|2\vec{k}_2-\vec{k}_1|-|\vec{K}|) \cdot L > \pi$
  (ii) $(|\vec{k}_1+2(\vec{k}_3-\vec{k}_2)|-|\vec{K}|) \cdot L \ll \pi$
  (iii) wherein $\vec{K}_1$, $\vec{K}_2$, and $\vec{K}_3$ are the wave vector of first, second and third light pulses, respectively, L is the length of the crystal, and $|\vec{K}|=|\vec{K}_1|=|\vec{K}_2|$ (where the operator |.| designates the modulus of a vector).

32. The method of claim 31, wherein the storage medium is an impurity-doped crystal.

33. The method of claim 32, wherein the impurity-doped crystal is a rare-earth ion doped crystal.

34. The method of claim 31, further comprising emitting the second and third light pulses such that they counter propagate with the first light pulse.

35. The method of claim 31, further comprising emitting the second light pulse with a direction spaced by a π/3 radian angle with respect to the direction of the first light pulse, and emitting the third light pulse with a direction spaced by a π/3 radian angle with respect to the direction of the second light pulse.

36. The method of claim 31, wherein the second and third light pulses are π-pulses.

37. The method of claim 31, wherein the first, second and third light pulses are emitted with respective time/frequency profiles such that the frequency span of the first pulse is included in the respective frequency spans of the second and third pulses.

38. The method of claim 31, wherein the second and third light pulses are frequency chirped pulses with a time profile such that only the combination of the second and third light pulses can phase together the atomic coherences of the atoms of the ensemble.

39. The method of claim 38, wherein the second and third light pulses are Adiabatic Rapid Passage (ARP) pulses.

40. The method of claim 38, wherein the second and third light pulses are Complex Hyperbolic Secant (CHS) pulses.

* * * * *